(12) United States Patent
Lee

(10) Patent No.: US 6,964,921 B2
(45) Date of Patent: Nov. 15, 2005

(54) METHOD FOR FORMING BIT LINE OF FLASH DEVICE

(75) Inventor: Byung Seok Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/734,389

(22) Filed: Dec. 12, 2003

(65) Prior Publication Data

US 2004/0266106 A1     Dec. 30, 2004

(30) Foreign Application Priority Data

Jun. 30, 2003  (KR) ..................... 10-2003-0043798

(51) Int. Cl.[7] ............................................. H01L 21/44
(52) U.S. Cl. ...................................... 438/672; 257/764
(58) Field of Search ................................ 438/257, 279, 438/671–675, 700–703, 710–717; 257/315, 257/764

(56) References Cited

U.S. PATENT DOCUMENTS 6,150,073 A * 11/2000 Huang ........................ 430/313
6,613,647 B2   9/2003 Kim ............................ 438/424
2003/0205723 A1 * 11/2003 Hawley et al. ............. 257/200
2004/0142557 A1 *  7/2004 Levy et al. .................. 438/680

FOREIGN PATENT DOCUMENTS

| KR | 10-2001-0045400 | 6/2001 |
| KR | 10-2002-0083807 | 11/2002 |

* cited by examiner

*Primary Examiner*—David Nelms
*Assistant Examiner*—Calvin Lee
(74) *Attorney, Agent, or Firm*—Marshall, Gerstein & Borun LLP

(57) ABSTRACT

Disclosed herein is a method for forming a bit line of a flash device capable of reducing loss of an interlayer insulation film between the bit line patterns. The method includes forming a bit line metal hard-mask pattern prior to forming a bit line mask pattern, preventing an interval between the bit lines from being reduced by controlling conditions of a cleaning process prior to forming a metal film. The method obviates an additional process of removing the metal hard-mask film since the metal hard-mask film is also removed at the same time of carrying out a bit line planarization process.

8 Claims, 4 Drawing Sheets

METHOD FOR FORMING BIT LINE OF FLASH DEVICE

BACKGROUND

1. Field of the Invention

The present invention relates to a method for forming a bit line of a flash device and, more specifically, to a method for forming a bit line of a flash device capable of reducing a crosstalk phenomenon by significantly holding an interval between bit lines.

2. Discussion of Related Art

In a flash device with a level of 100 nanometers (nm) or less, an interval between bit line patterns is gradually decreased as a pattern size of an underlying element is decreased, whereby a RC delay caused due to coupling capacitances has been looming large as a serious problem.

Shown in FIG. 1 is a cross-sectional view illustrating a problem due to a decrease in an interval between bit line patterns of the conventional flash device. Referring to FIG. 1, metal films such as a lower word line W/L, neighbor bit lines B and C, and an upper metal line M2 are coupled with a bit line A to form coupling capacitances. The word line W/L and the bit line A are electrically isolated by a first interlayer insulation film, and a first inter-capacitance C01 is formed therebetween. In addition, the bit line A and the neighbor bit lines B and C are electrically isolated by a second interlayer insulation film, and a second inter-capacitance C11 is formed therebetween. In addition, the bit line A and the upper metal wire M2 are electrically isolated by a third interlayer insulation film, and a third inter-capacitance C12 is formed therebetween.

The calculation of coupling capacitances associated with the bit line A using a SAKURAI Model is as follows: "D" indicates an interval between the word line W/L and the bit line B/L; "T" indicates a height of the bit line B/L; "W" indicates a thickness of the bit line B/L; "S" indicates an interval between the neighbor bit lines B/L; "H" indicates an interval between the bit line B/L and the upper metal wire M2; "C01" indicates a first inter-capacitance; "C11" indicates a second inter-capacitance; and, "C12" indicates a third inter-capacitance.

The first to third inter-capacitances according to the SAKURAI Model are as follows:

$$C01/_\epsilon ox = 1.15 \times (W/D) + 2.80(T/D) \times 0.222 - 0.07(T/D) \times 0.222 \times (S/D) \times 1.34$$

$$C11/_\epsilon ox = (0.03 \times (W/D) + 0.83(T/D)) \times (S/D) - 1.34$$

$$C12/_\epsilon ox = 1.15 \times (W/H) + 2.80(T/D) \times 0.222 - 0.07(T/D) \times 0.222 \times (S/H) \times 1.34$$

The total capacitance C generated at the bit lines due to the first to the third inter-capacitances becomes as follows:

$$C = C01 + 2C11 + C12.$$

As shown in the aforementioned equations, it is noted that in the coupling capacitances, the thickness W of the bit line pattern and the interval S between the bit lines are important components. Namely, in order to reduce the bit line capacitances, it is efficient to decrease the thickness W of the bit line and increase the interval S between the neighbor bit lines. However, if the thickness W of the bit line and the interval S between the neighbor bit lines are excessively decreased, the bit line resistance is increased. Therefore, it is necessary to find optimum conditions for considering two components, that is, the thickness W of the bit line and the interval S between the neighbor bit lines. However, although the optimum conditions are taken by using the aforementioned equation and simulation, it is difficult to actually apply the optimum conditions to the bit line forming process.

Shown in FIG. 2 is a layout diagram illustrating a problem due to the conventional method of forming a bit line of a flash device. Referring to FIG. 2, the bit line B/L is formed vertically with respect to the lower word line W/L. In this figure, a dot line indicates a final bit line pattern, and a solid line indicates a bit line pattern formed using conventional processes. As shown in FIG. 2, S10 indicates a target interval between the bit lines, and S20 indicates an interval between the bit lines formed using conventional processes. In other words, the target interval S10 between the bit lines becomes larger than the interval S20 between the bit lines. Therefore, according to the aforementioned equation, the capacitance C11 becomes large and the total capacitance of the bit lines B/L is increased, whereby a serious problem caused by RC delay is generated.

Shown in FIGS. 3A to 3C are cross-sectional views taken by a II–II' line in FIG. 2. Referring to FIG. 3A to 3C, a barrier film 14 and an interlayer insulation film 16 are sequentially formed on the semiconductor substrate 10, on which a word line (not shown) and a bit line contact plug 12 are formed. A bit line trench 20 is formed by etching the interlayer insulation film 16 and the barrier film 14 using a photosensitive film pattern 18. A bit line 30 is formed by, for example, carrying out a planarization process using a chemical and mechanical polishing process after burying metal in the bit line trench 20. However, it is difficult to hold the interval S10 between the target bit lines 30 because a part of the photosensitive film pattern 18 is also etched in the etching process for forming the bit line trench 20. Furthermore, there is a problem that the interval S10 between the bit lines 30 is decreased because a part of the inter insulation film 16 also is etched in a cleaning process prior to the process of burying metal. A dot line of FIG. 3B indicates a shape of the target bit line trench, and a solid line of FIG. 3B indicates a shape of the bit line trench formed actually after carrying out the etching process. As shown in these figures, it is difficult to set the interval between the bit lines, that is, difference between S10 and S20 to target critical dimensions. Generally, in the etching process for forming the bit line trench 20, a thickness of about 25 nm of the interlayer insulation film 16 is lost, and in the cleaning process prior to the process of burying metal, thickness of about 30 nm of the interlayer insulation film 16 is lost.

SUMMARY OF THE INVENTION

Accordingly, the present invention is contrived to solve the problems, and is directed to a method of forming bit line of a flash device, capable of reducing loss of an interlayer insulation film between bit line patterns by forming a bit line hard-mask pattern prior to forming a bit line mask pattern, and preventing an interval between bit lines from being decreased by controlling conditions of a cleaning process prior to forming of a metal film.

One aspect of the present invention is to provide a method for forming a bit line of a flash device, comprising the steps of forming a barrier film, an interlayer insulation film, and a metal hard-mask film sequentially on a semiconductor substrate, on which a bit line contact plug is formed; forming a metal hard-mask film pattern for opening a bit line area corresponding to the bit line contact plug by, for example, patterning the metal hard mask film; forming a bit line trench by, for example, etching the interlayer insulation film and the barrier film using the metal hard-mask film pattern as an etching mask; forming a bit line metal film to bury the bit line trench; and removing the bit line metal film and the metal hard mask film on the interlayer insulation film by; for example, carrying out a planarization process.

The method also can include between the step of forming the bit line trench and before the step of forming the bit line metal film, a step of cleaning the bit line trench by, for example, carrying out a dry cleaning process using plasma or a cleaning process by high-frequency sputtering.

In another embodiment of the present invention, the dry cleaning process is performed using a mixed gas of $CF_4$ and $O_2$ and $NF_3$ gas, and the cleaning process by high-frequency sputtering is performed using Ar gas.

In another embodiment of the present invention, the metal hard-mask film and the bit line metal film are formed using the same metal material.

In another embodiment of the present invention, the metal hard-mask film is formed using tungsten (W) with a thickness in the range of 500 Å to 1000 Å to endure significantly as an etching barrier in the subsequent process of etching the interlayer insulation film.

BRIEF DESCRIPTION OF THE DRAWINGS

The above and other objects, advantages and features of the present invention will become apparent from the following description of preferred embodiments given in conjunction with accompanying drawings, in which.

DETAILED DESCRIPTION OF PREFERRED EMBODIMENTS

Figure 1:
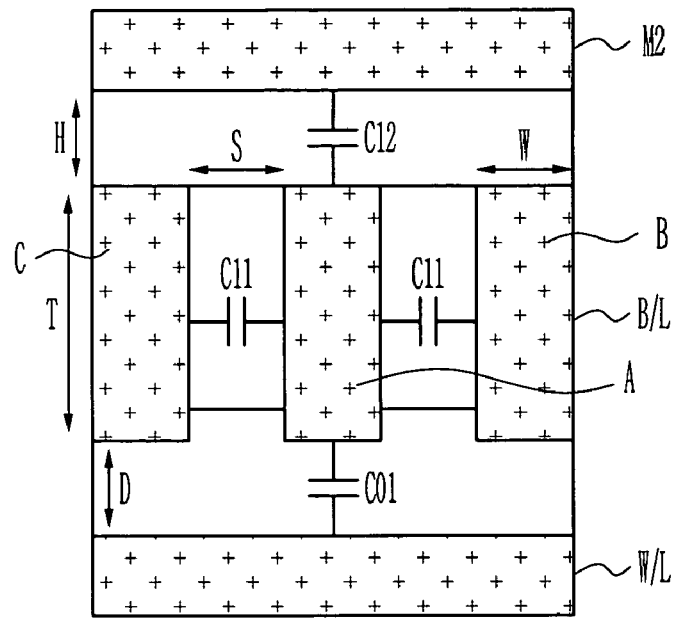
FIG. 1 is a cross-sectional view illustrating a problem due to a decrease in a pattern size between bit lines of the conventional flash device.
Figure 2:
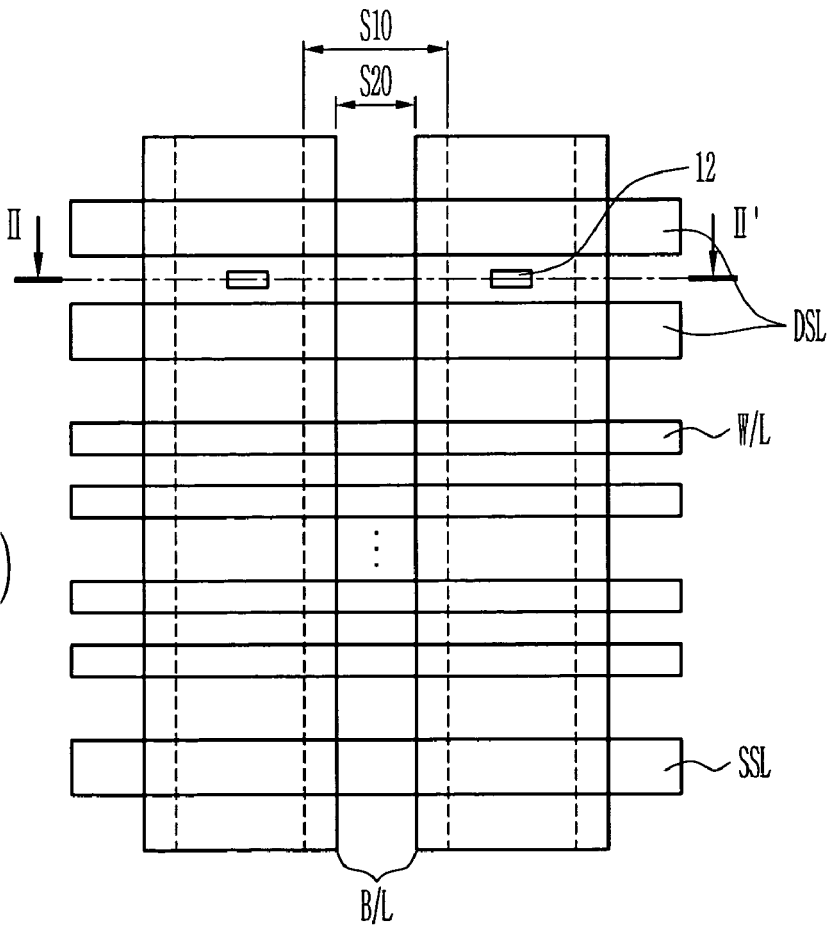
FIG. 2 is a lay-out diagram illustrating a problem due to a conventional method of forming a bit line of a flash device.
Figure 3A:
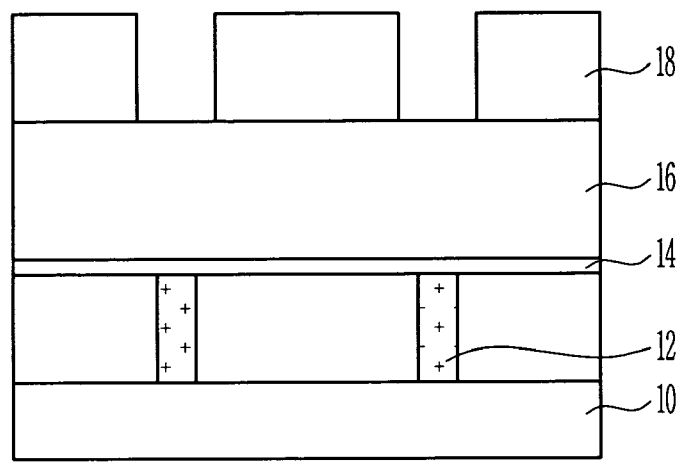
FIGS. 3A thru 3C are cross-sectional views taken along II–II' line in FIG. 2.
Figure 3B:
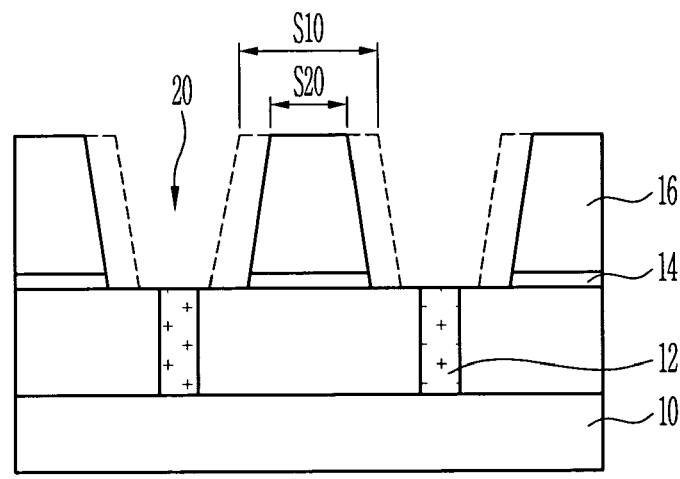
Figure 3C:
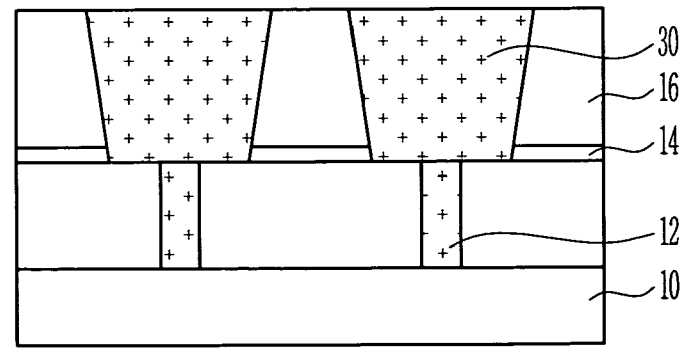

Now, embodiments of the present invention will be described in detail with reference to accompanying drawings. However, present invention is not limited to the embodiments disclosed in the following description, but can be implemented into various changes and modifications. Thus, these embodiments according to the present invention are intended to inform those skilled in the art of a scope of the present invention. The same component in the drawings is referred to the same numeral.

Figure 4:
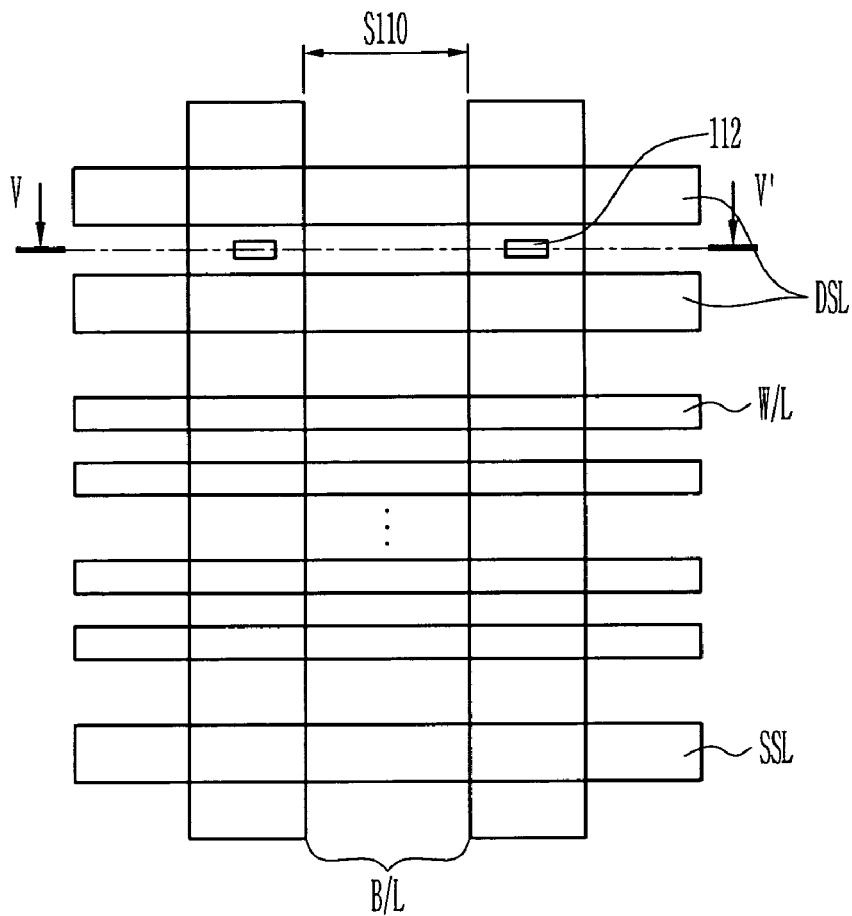
FIG. 4 is a lay-out diagram showing a bit line of a flash device according to the present invention; and, FIGS. 5A to 5D are cross-sectional views taken along V–V' line in FIG. 4 for the purpose of illustrating a method for forming a bit line of a flash device according to the present invention.

Shown in FIG. 4 is a lay-out diagram showing a bit line of a flash device according to the present invention. Referring to FIG. 4, a bit line B/L pattern is formed using a patterning process on a semiconductor substrate, on which word line W/L, DSL, SSL, and bit line contact plug 112 are formed. The bit line B/L of the present invention are allowed to constantly hold an interval between target bit lines by controlling conditions of a hard-mask film forming process and a cleaning process. Now, an aspect of a manufacturing method of a NAND flash device with a level of 100 nanometers or less will be described. It is preferable that a thickness of the bit line B/L is about 2500 Å and a pitch of the bit line is about 270 nm.

Figure 5A:
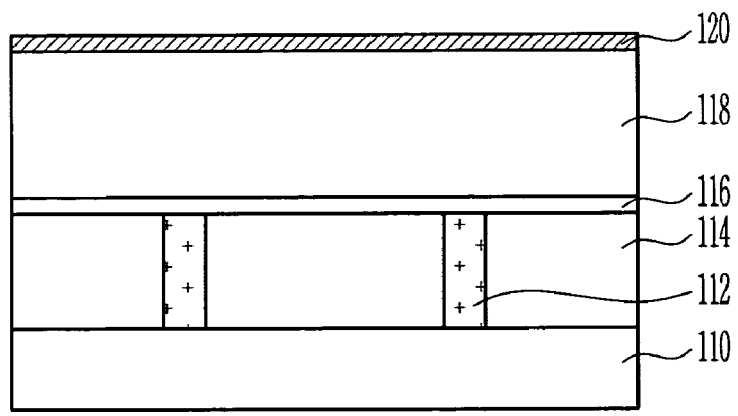

FIGS. 5A to 5D are cross-sectional views taken by a V–V' line in FIG. 4 for the purpose of illustrating a method of forming bit line of a flash device according to the present invention. Referring to FIG. 5A, a bit line contact plug 112 is formed by patterning a first interlayer film 114 on a semiconductor substrate 110 on which various elements including semiconductor elements such as transistors and capacitors can be formed. A barrier film 116, a second interlayer insulation film 118, and a metal hard-mask film 120 are formed on the semiconductor substrate 110, on which the bit line contact plug 112 is formed.

The first interlayer insulation film 114 is formed on the whole structure and patterned to form a contact hole (not shown) for opening junction of the DSL transistor, whereby the DSL, the SSL, and the cell string (i.e. the word line W/L) are isolated from each other. At that time, it is preferable that the bit line contact plug 112 is formed by burying metal in the contact hole.

A barrier film 116, which protects lower structures and prevents them from being etched in the subsequent etching process of forming the bit line trench, is formed on the first interlayer insulation film 114. Preferably the barrier film 116 is formed using materials that have etching selectivity larger than that of the first and the second interlayer insulation films 114, 118. Preferably that the second insulation film 118 is formed by use of materials having lower permittivity as materials in which the bit line pattern is to be formed. Preferably the first and the second interlayer insulation films 114, 118 are formed by one or more materials selected from the group consisting of boron phosphorus silicate glass (BPSG) based oxide, phosphorus silicate glass (PSG) based oxide, fluorinated silicate glass (FSG) based oxide, tetra ethyl ortho silicate (PE-TEOS) based oxide, plasma enhanced $SiH_4$ (PE-$SiH_4$) based oxide, high density plasma (HDP) undoped silicate glass (USG) based oxide, HDP PSG based oxide, and advanced planarization layer (APL) oxide. When the first and the second interlayer insulation films 114, 118 are formed using the aforementioned materials, preferably the barrier film 116 is formed by plasma-enhanced based PE nitride and/or oxynitride. The aforementioned etching selectivity means that etching ratios in the first and second films made of different materials are different in the case of etching the first and second films under predetermined etching conditions. For example, when an oxide film and a nitride film are exposed in a predetermined etching gas, the oxide film is etched by 10 Å thickness per second, and the nitride film is etched by 1 Å thickness per second. This is referred to as "difference etching selectivity." In addition, this means that the nitride film is not etched well but the oxide film is etched well under predetermined conditions.

Preferably the metal hard-mask film 120 is formed by use of materials which are the same as a metal film constituting the bit line, so as to easily remove the metal hard-mask film 120 from the second interlayer insulation film 118 in a subsequent planarization process using chemical and mechanical processes after burying metal in a bit line trench. Preferably the metal hard-mask film 120 is formed by use of materials having etching selectivity larger than that of the second interlayer insulation film 118. Therefore, it is possible to prevent critical dimensions of the bit line from being broader in the following etching process of forming the bit line trench and cleaning process. In this embodiment, it is preferable that the metal hard-mask film 120 is formed using tungsten (W) film. The thickness of the tungsten film should be sufficient to endure as an etching barrier in the following process of etching the oxide film. Preferably the tungsten film has a thickness of about 500 Å to 1000 Å.

Figure 5B:
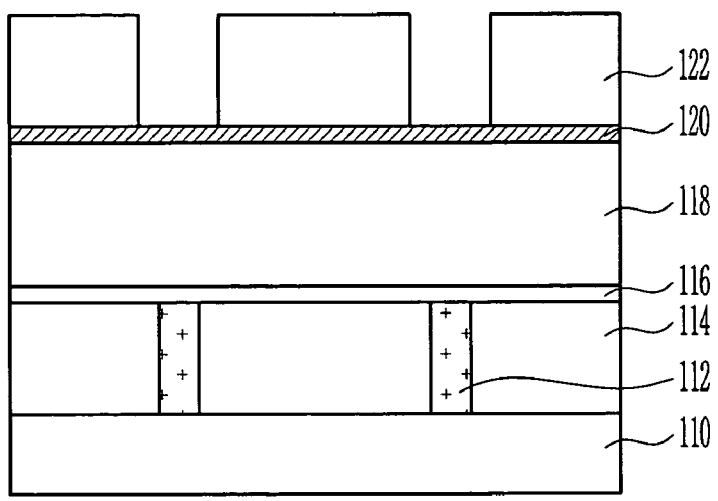
Figure 5C:
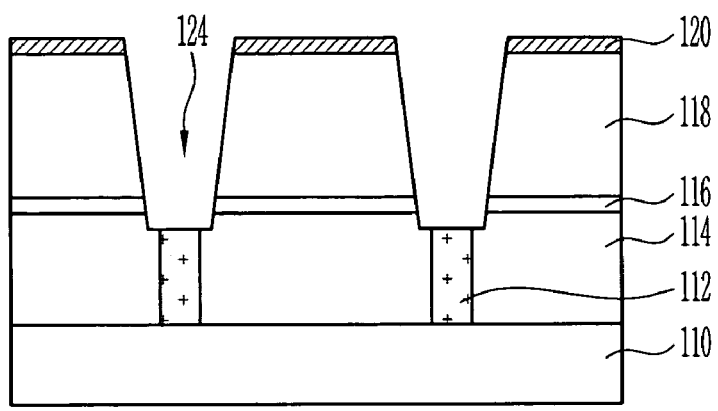

Referring to FIGS. 5B and 5C, a bit line trench 124 is formed by patterning the metal hard-mask film 120, the second interlayer insulation film 118, and the barrier film 116. At that time, a part of the first interlayer insulation film under the trench also is etched, thereby enhancing electrical contact with the lower bit line contact plug 112.

A photosensitive film pattern 122 for opening an area where the bit line is to be formed is formed by carrying out a photo etching process using a bit line mask after coating the photosensitive film on the whole structure. Preferably the metal hard-mask film pattern is formed by etching the metal hard-mask film 120 using the photosensitive film pattern 122 as an etching mask. Then, the photosensitive film pattern is removed and subsequent processes are carried out. The metal hard-mask film 120 is formed to have a shape, that is the same as the target bit line pattern. A pattern of the hard-mask film 120 is formed to open only the second interlayer insulation film 118 of the bit line, so that the metal hard mask film 120 remains on an area between the bit lines. Preferably a pattern width of the remaining metal hard-mask film 120 is the same as S110 shown in FIG. 4. Preferably $SF_6$ gas is included in the etching process of the metal hard-mask film 120 using tungsten (W).

The second interlayer insulation film 118 is etched by carrying out an etching process for using the metal hard-mask film 120 as an etching mask. Preferably a bit line trench 124 is formed by etching the exposed barrier film 116 and a part of the first interlayer insulation film 114. However, the bit line trench 124 can be formed by etching the second interlayer insulation film 118 and the barrier film 116, and over-etching a part of the first interlayer insulation film 114, using the metal hard-mask film 120 as an etching mask.

Figure 5D:
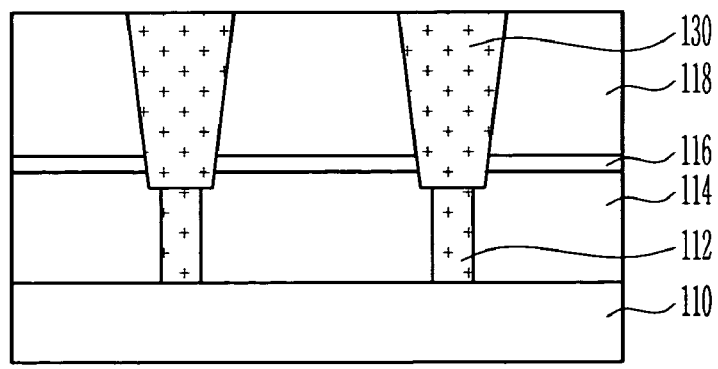

Referring to FIG. 5D, the bit line trench 124 is cleaned by carrying out a cleaning process and then the bit line metal film (not shown) is deposited to be buried in the bit line trench 124. A bit line 130 is formed by removing the bit line metal film and the metal hard-mask film 120 on the second interlayer insulation film 118 using a chemical and mechanical polishing process. At that time, over-planarization process may be carried out to electrically isolate between the bit lines.

Preferably the cleaning process is a dry cleaning process using plasma or a cleaning process by high frequency sputtering. The reason is that when a wet cleaning process is carried out, cleaning solution thereof generates loss of the second insulation film 118 under the metal hard-mask film 120. Accordingly, when the dry cleaning process using plasma or the cleaning process using the high-frequency sputtering is carried out, the metal hard-mask film 120 is used as an etching protection film to prevent the lower second interlayer insulation film 118 from being etched and prevent critical dimensions of a pattern of the bit line 130 from being broaden (or, prevent critical dimensions between the bit lines from being decreased). Preferably the dry cleaning process is carried out using a microwave plasma turn-on apparatus in a mixed gas of $CF_4$ and $O_2$ and $NF_3$ gas under a high pressure and a low voltage. The high frequency sputtering means that a high frequency etching process is carried out prior to a metal film depositing process, and the sputtering is preferably carried out using a high frequency bias in argon (Ar) gas.

The bit line metal film can be formed using any one of tungsten (W), aluminum (Al), and copper (Cu). In this embodiment, it is preferable to form the bit line metal film using tungsten (W).

Preferably the planarization process is carried out to remove the metal film formed on the second interlayer insulation film 118. The metal hard-mask film 120 on the second interlayer insulation film 118 also can be removed at the same time of forming a pattern of the bit line 130 by carrying out only the chemical and mechanical polishing process. Furthermore, since the bit line metal film and the metal hard-mask film 120 are made of the same materials, the process of removing the metal hard-mask film 120 is not required any longer.

Accordingly, it is possible to significantly prevent decreases in the critical dimensions between the bit lines, considered as a problem in the conventional bit line forming process. Therefore, the bit line formed along the forming processes of the present invention is capable of constantly holding a thickness W of the bit line and an interval S between the bit lines.

As described above, according to the present invention, it is possible to reduce loss of the interlayer insulation film between the bit line patterns by forming the bit line metal hard-mask pattern prior to forming the bit line mask pattern.

Furthermore, it is possible to prevent an interval between the bit lines from being decreased by controlling conditions of the cleaning process prior to forming the metal film.

Furthermore, since the metal hard-mask film is also removed at the same time of carrying out the planarization process of forming the bit line, an additional process of removing the metal hard-mask film is not required.

What is claimed is:

1. A method for forming a bit line of a flash device, the method comprising the steps of:
    (a) forming a barrier film, an interlayer insulation film, and a metal hard-mask film sequentially on a semiconductor substrate, on which a bit line contact plug is formed;
    (b) forming a metal hard-mask film pattern for opening a bit line area corresponding to the bit line contact plug;
    (c) forming a bit line trench;
    (d) forming a bit line metal film on the entire structure including the metal hard-mask film to bury the bit line trench; and,
    (e) removing the bit line metal film and the metal hard mask film on the interlayer insulation film with a metal material by means of CMP,
    wherein the metal hard-mask film and the bit line metal film are formed using the same metal material so that the metal hard-mask film and the bit line metal film can be removed at the same time by the CMP.

2. The method of claim 1, further comprising between steps (c) and (d), a step of cleaning the bit line trench.

3. The method of claim 2, wherein the cleaning step comprises a dry cleaning process using plasma or a cleaning process by high-frequency sputtering.

4. The method of claim 3, wherein the dry cleaning process is performed using a mixed gas of $CF_4$ and $O_2$ and $NF_3$ gas, and the cleaning process by high-frequency sputtering is performed using Ar gas.

5. The method of claim 1, the metal hard-mask film is formed using tungsten (W) with a thickness in the range of 500 Å to 1000 Å to endure significantly as an etching barrier in the subsequent process of etching the interlayer insulation film.

6. The method of claim 1, wherein step (b) comprises patterning the metal hard-mask film.

7. The method of claim 1, wherein step (c) comprises etching the interlayer insulation film and the barrier film using the metal hard-mask film pattern as an etching mask.

8. The method of claim 1, wherein step (e) comprises a planarization process.

* * * * *